United States Patent

[11] 3,577,018

[72] Inventors Toshio Wada;
Yasuo Matsukura; Kuniichi Ohta, Tokyo, Japan
[21] Appl. No. 806,830
[22] Filed Mar. 13, 1969
[45] Patented May 4, 1971
[73] Assignee Nippon Electric Company, Limited Tokyo, Japan
[32] Priority Mar. 15, 1968
[33] Japan
[31] 43/17141

[54] HIGH-SPEED LOGIC DEVICE EMPLOYING A GUNN-EFFECT ELEMENT AND A SEMICONDUCTOR LASER ELEMENT
12 Claims, 27 Drawing Figs.

[52] U.S. Cl. .......... 307/299, 317/234, 307/312, 250/211, 307/203
[51] Int. Cl. .......... H01l 19/00
[50] Field of Search .......... 317/234.10; 331/107 (G), 945; 313/108 (D); 250/211 (J); 307/312

[56] References Cited

UNITED STATES PATENTS

| | | | |
|---|---|---|---|
| 3,365,583 | 1/1968 | Gunn .......... | 317/234 |
| 3,377,566 | 4/1968 | Lanza .......... | 317/234 |
| 3,431,437 | 3/1969 | Kosonocky .......... | 307/312 |
| 3,440,425 | 4/1969 | Hutson et al .......... | 317/234 |

FOREIGN PATENTS

| | | | |
|---|---|---|---|
| 1,498,778 | 9/1967 | France .......... | 317/234 |

OTHER REFERENCES

IBM Tech Discl Bul, " A High Frequency (1— 10GHz) Modulated Light Source" by Lanza Vol. 10, No. 5, Oct. 1967 page 593 313/108D

*Primary Examiner*—Jerry D. Craig
*Attorney*—Hopgood and Calimafde

ABSTRACT: A semiconductor device is described wherein a Gunn effect element is placed in series with the PN junction of a semiconductor laser. A bias potential is applied across the series connection to forwardly bias the PN junction and normally produce lasing action from the laser element. The bias potential is further selected so that current reductions produced by high electric field layers traveling within the Gunn element effectively suppress lasing actions. Several embodiments are shown.

INVENTORS
TOSHIO WADA
YASUO MATSUKURA
BY KUNIICHI OHTA

Sandoe, Hopgood & Calimafde
ATTORNEYS

INVENTORS
TOSHIO WADA
YASUO MATSUKURA
KUNIICHI OHTA
BY
Sandoe, Hopgood & Calimafde
ATTORNEYS

INVENTORS
TOSHIO WADA
YASUO MATSUKURA
KUNIICHI OHTA

BY Sandoe, Hopgood & Calimafde
ATTORNEYS

INVENTORS
TOSHIO WADA
YASUO MATSUKURA
KUNIICHI OHTA
BY
Sandoe, Hopgood & Calimafde
ATTORNEYS INVENTORS
TOSHIO WADA
YASUO MATSUKURA
KUNIICHI OHTA
BY
Sandoe, Hopgood & Calimafde
ATTORNEYS

HIGH-SPEED LOGIC DEVICE EMPLOYING A GUNN-EFFECT ELEMENT AND A SEMICONDUCTOR LASER ELEMENT

This invention relates to a high-speed logic semiconductor device and more specifically relates to such device including a Gunn effect element and a semiconductor laser element.

Recently, the demand for high-speed logic devices has increased sharply. To meet the high-speed requirements, Gunn effect elements and semiconductor laser elements which operate at high speed have been developed as substitutes for conventional logic elements, such as transistors and diodes.

The Gunn effect element is an element that utilizes an internal electric field. In the Gunn element a high-electric-field-layer (abbreviated "high-field layer" in the following) is produced near the cathode of the Gunn effect element and moves toward the anode when the internal field exceeds a threshold value. This Gunn element may be produced with various logic functions depending on the geometrical form of the propagating path of the high-field layer.

The semiconductor laser element produces a laser light from a PN junction when a forward current flowing through the junction exceeds a threshold value. This semiconductor laser element may provide logic functions depending upon the shape of the junction, the arrangement of a plurality of junctions, or an external associated circuit. These logic functions of semiconductor lasers and Gunn effect elements have been attained only with these elements in separated form. To combine these two elements and utilize their high-speed capability in a logic circuit would be of great advantage. Several questions always involved in combining such fast circuit elements are how to introduce input and output signals to and from the combined logic device, and how these elements may be combined. A further question relates to devising a means for generating high-speed pulses necessary for the high-speed control of the Gunn and laser elements.

A prime object of this invention is therefore to provide a practical high-speed semiconductor device by placing a semiconductor element in series with a Gunn effect element.

A further object of this invention is to provide a high-speed logic device utilizing a combination of Gunn effect and semiconductor laser elements.

It is still further an object of this invention to combine a Gunn effect element and a semiconductor laser to form a high-speed semiconductor device.

Another object of the invention is to provide a semiconductor device for use with a large variety of logic functions at high operating speeds.

According to this invention, a semiconductor device is provided wherein a semiconductor laser element and a Gunn effect element are connected in series. Means for producing a voltage across said serially connected elements is provided to bias the elements at their proper operating point. The Gunn effect element and the semiconductor laser element forming the series connection are so selected with the voltage biasing means that the current flowing through the series connection, when a high-field layer exists in the Gunn effect element, is less than a lasing threshold current for establishing lasing action from the laser element, and that the lasing threshold current is less than the current needed to initiate the formation of a high-field layer in said Gunn effect element.

In general, current flowing through a Gunn effect element sharply decreases, by approximately one-half, upon the formation of a high-field layer. This current decrease appears as a sudden increase in the impedance across the Gunn element. The device of this invention is capable of controlling the laser light emission by using this increase in the impedance of the Gunn effect element caused by the growth of a high-field layer. For this reason, the high-field layer in the Gunn effect element is produced at the same time when the series-connected Gunn and laser elements are supplied with currents larger than a lasing threshold current. Thus, were it not for the formation of a high-field layer, a lasing of the laser element would occur; stated otherwise, the formation of the high-field layer delays the formation of the laser pulse. The interval during which the laser light emission is interrupted or delayed is equal to the duration of the high-field layer in the Gunn effect element. Since the high-field layer duration is solely dependent upon the characteristic or shape of the Gunn effect element one may control the laser pulse by appropriately shaping the Gunn element.

The light output pulse of the semiconductor device of the invention is of very short duration determined by the time interval in which the high-field layer is not present in the Gunn effect element. This feature makes it possible to provide a high-speed logic device wherein the laser pulses are used as data carriers. Furthermore, since the laser pulse is on-off controlled at high speeds in response to the formation and extinction of the high-field layer in the Gunn effect element, the laser pulse can be advantageously utilized to carry a large amount of data.

The above mentioned and other features and objects of this invention and the manner of attaining them will become more apparent and the invention itself will best be understood by reference to the following description of embodiments of the invention taken in conjunction with the accompanying drawings, the description of which follows.

FIGS. 1A through 1C respectively are a circuit diagram, a perspective view, and a sectional view of a first embodiment of this invention;

Figure 4A:
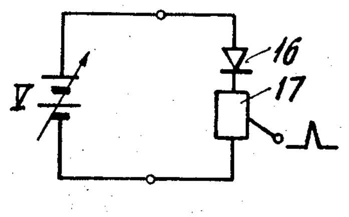
Figure 4B:
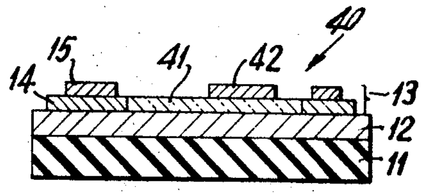
Figure 5A:
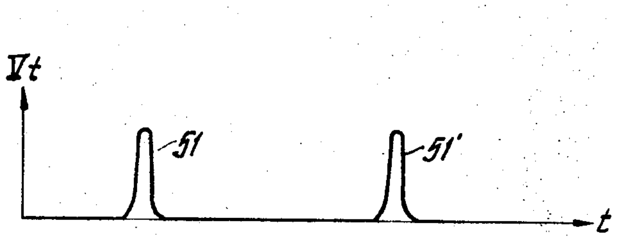
Figure 5B:
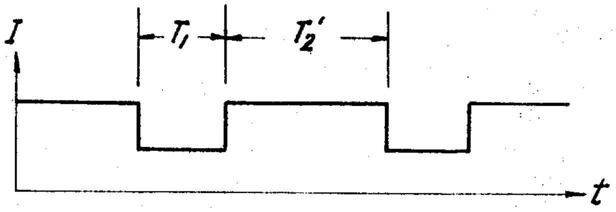
Figure 5C:
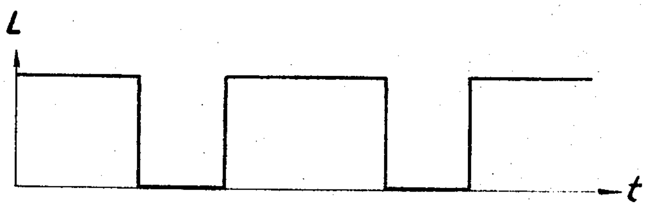
Figure 6B:
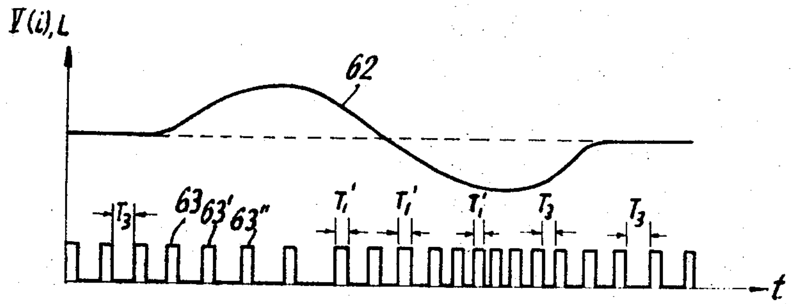
Figure 6A:
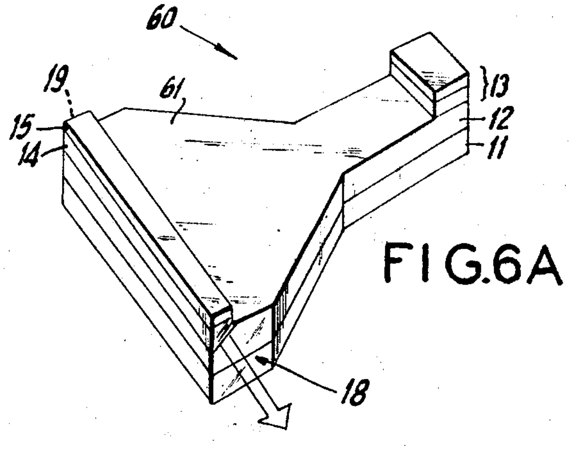
Figure 7A:
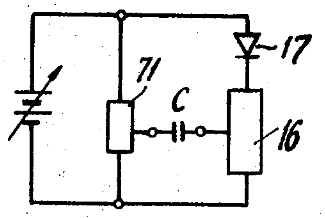
Figure 7B:
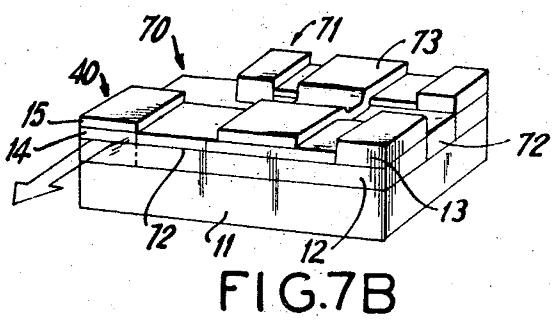
Figure 8A:
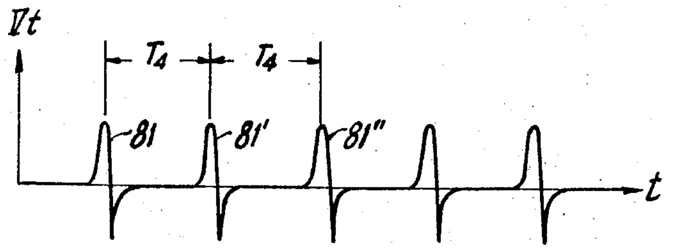
Figure 8B:
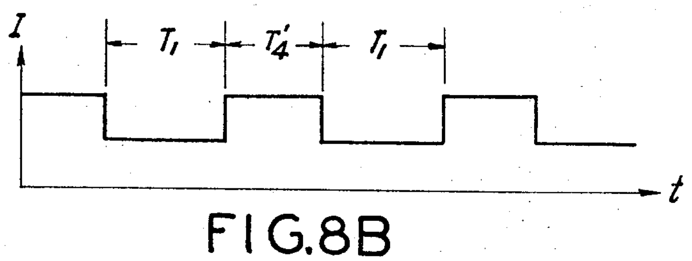
Figure 8C:
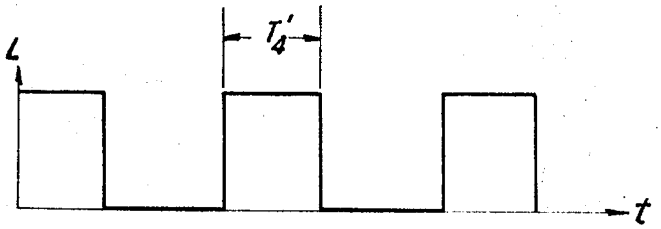
Figure 9A:
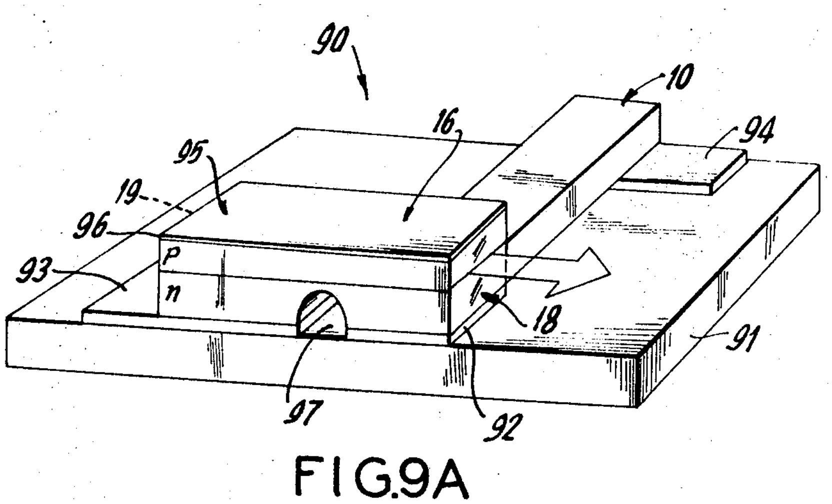
Figure 9B:
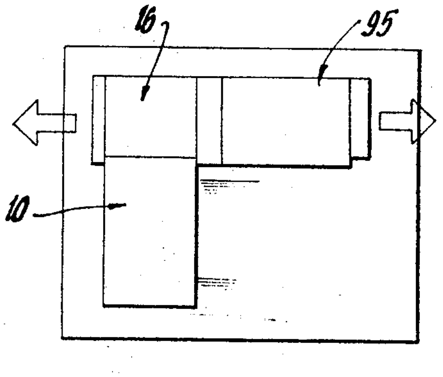
Figure 9C:
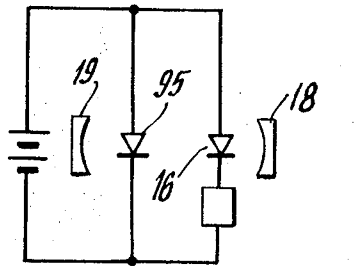

FIGS. 4A and 4B respectively are a circuit diagram and a sectional view of a second embodiment of this invention;

FIGS. 5A through 5C are waveforms for explaining the second embodiment;

FIG. 6A is a perspective view of a third embodiment of this invention;

FIG. 6B is a waveform for explaining the third embodiment;

FIGS. 7A and 7B respectively are a circuit diagram and a perspective view of a fourth embodiment of this invention;

FIGS. 8A through 8C are waveforms for explaining the fourth embodiment;

FIGS. 9A through 9C respectively are a perspective view, a plan view, and a circuit diagram of a fifth embodiment of this invention; and FIGS. 10A, 11A, 12A and 10B, 11B, 12B are plan views and circuit diagrams of further embodiments of this invention.

Figure 1A:
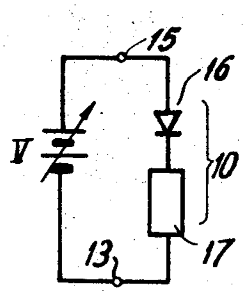
Figure 1B:
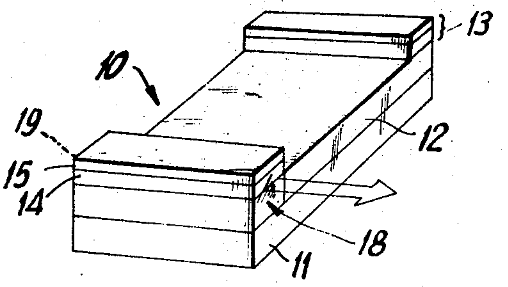
Figure 1C:
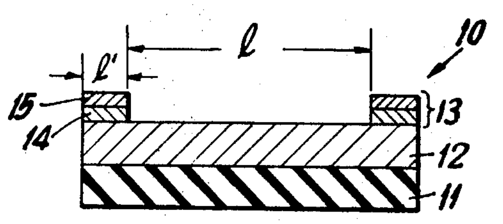

In a semiconductor device 10 of this invention shown in FIGS. 1A through 1C, an N-type gallium-arsenic region 12 containing about $3\times10^{15}$ atoms/cm.$^3$ of tellurium as N-type impurity is formed on a highly insulative gallium-arsenide substrate 11 through epitaxial growth. The semiconductor device 10 further comprises an $N^+$-type gallium-arsenic region to form an ohmic electrode 13 at one end of region 12. A gallium-arsenic P region 14 is formed at the other end of region 12 either by vapor epitaxial growth or by liquid epitaxial growth. A metal electrode 15 is formed over the region 14. With reference to the N-type region 12, the distance $l$ between electrodes 13 and 15 is 150$\mu$, the width is 80$\mu$, and the thickness is 50$\mu$. The region 14 is P-type and contains zinc of about $10^{18}$ atoms/cm.$^3$ as a P-type impurity. The width $l'$ of the P-type region 14 is 10$\mu$, and is provided with parallel side planes 18 and 19 which are surface finished by mirror-polishing to serve as an optical resonator for a semiconductor laser formed between the PN junction of region 14 and 12. In this structure of FIG. 1, the semiconductor device 10 is composed of a series connection between a semiconductor laser element 16, formed of a PN junction between a P-type region 14 and an N-type region 12, and a Gunn effect element 17 formed by the region 12 between two electrodes 13 and 15.

This semiconductor device 10 shown in FIG. 1A, is connected to a power source V with the negative terminal coupled to ohmic electrode 13 (cathode) and the positive terminal to ohmic electrode 15 (the anode). With this connection a forward biasing current is applied across the laser PN junction. When the current supplied from the power source V reaches 0.24 amperes, a laser action is induced at the PN junction, and a laser light emanates from the resonator in a direction perpendicular to the side surfaces 18 and 19. Further increase of the circuit current up to about 0.3 amperes causes the formation of a high-field layer in the Gunn effect element, reduces the current to about one-half (0.15 amperes), and thus interrupts the emission of the laser light oscillation. The high-field layer travels from the cathode, in the vicinity of which it starts, and is extinguished at the anode.

Figure 2A:
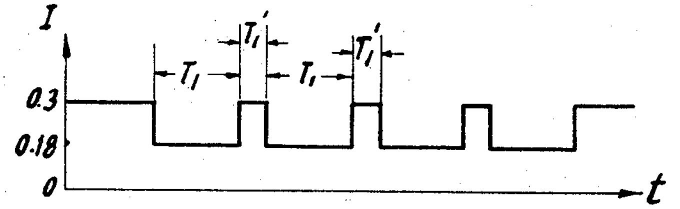
FIGS. 2A and 2B are waveforms for explaining the first embodiment.
Figure 2B:
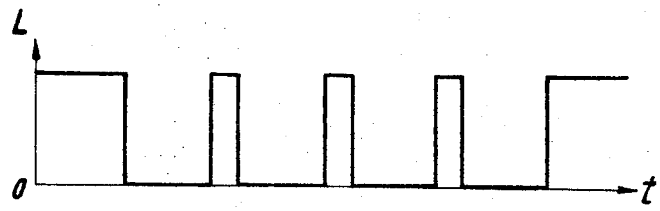

In FIGS. 2A and 2B the abscissas represent time $t$ and the ordinates represent the series circuit current I and light output L. The semiconductor device 10 reduces the circuit current I by approximately 40 percent during the time interval when the high-field layer is formed in the Gunn effect element. While the circuit current is reduced, the forward current flowing through the laser element is kept below the lasing threshold value, thereby reducing the output L of the laser light to substantially zero. Thus, the duration T in which the high-field layer exists in the Gunn effect element and duration $T_1'$ in which no high-field layer exists, respectively corresponds with the nonemission duration and the emission duration of the laser element. The time for the high-field layer to form is shorter than $10^{110}$ second and the transmission speed of the layer within the Gunn effect element is about $10^7$ cm./sec. For a 150 micron long Gunn element, the laser emission duration $T_1'$ and the nonemission duration $T_1$ are nearly equal to 0.1 nanosecond and 1.5 nanoseconds, respectively. It should be understood that the time $T_1'$ duration of the light pulse, is essentially determined by the time needed to reform a high-field layer after it formed at the cathode and was extinguished at the anode.

Figure 3:
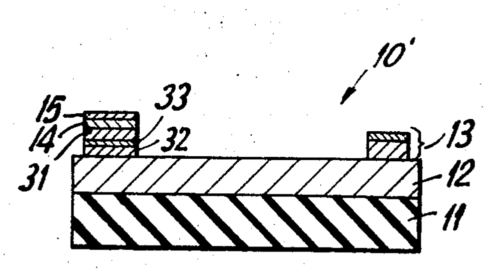
FIG. 3 is a sectional view of a modification of the first embodiment.

Referring to FIG. 3, a modification of the first embodiment includes a high concentration N-type region 32 and a metal electrode 33 formed through the same process employed for formation of the ohmic electrode 13. The region 32 and electrode 33 are disposed beneath the semiconductor laser element composed of a P-type region 14 and an N-type region 31 so that current can flow uniformly through the PN junction of the semiconductor laser element. The device of FIG. 3 is easier to manufacture than the device of FIG. 1, because it is completed by merely disposing the semiconductor laser element on an electrode already formed on the Gunn effect element. In addition, the current density can be more easily maintained uniform in comparison with the device of FIG. 1, because of the highly conductive electrode 33.

Referring to FIGS. 4A and 4B, semiconductor device 40, which is a second embodiment of this invention, has an insulation film 41 made of silicon-dioxide, silicon-nitride, or barium-titanate formed on one major face of the Gunn effect region 12 except at the end portions of the gallium-arsenide region 12. Over the insulation film 41 is attached a control electrode 42. As is known the internal field of the Gunn effect element can be kept just below the level needed to generate a high-field layer by the voltage V so that a triggering pulse applied to electrode 42 can generate the high-field layer. Hence, with the device 40 the laser light will be generated unless interrupted by a triggering pulse supplied to the control electrode 42. Thus, while the semiconductor device 40 is supplied with a current larger than the lasing threshold current of the semiconductor laser element 16 but less than the current value corresponding to the threshold field of the Gunn effect element 17, external control over the laser pulse duration may be exercised. The time interval of the interruption of the laser oscillation in this case is determined like that in the first embodiment, i.e., the duration of the high-field layer. The laser light emission thus resumes after the high-field layer has been extinguished until a subsequent trigger pulse is impressed again on the control terminal 42.

In FIGS. 5A through 5C the abscissas represent time $t$ and the ordinates represent trigger voltage $V_t$, current I, and light output L, respectively. The semiconductor device 40 under the action of a trigger pulse 51 experiences a reduced internal current during a certain definite time interval $T_1$ corresponding to the presence of the high-field layer induced by the trigger pulse 51, and this stops the laser light emission for a duration $T_1$. After the high-field layer is extinguished the laser light emission starts again and continues for a time interval $T_2'$ until the internal current is again reduced by impressing a subsequent trigger pulse 51'. In this embodiment, the control electrode may be provided to the Gunn effect region via a rectifying layer, such as a PN junction or a Schottky barrier.

Referring to FIGS. 6A and 6B a semiconductor device 60 of the third embodiment of this invention comprises an N-type gallium-arsenide region 61 having a tapered shape for gradually changing the field intensity of the electric field in the Gunn effect element. As disclosed in the specification of British Pat. No. 1,092,448, the tapered region 61 may control the propagating time of the high-field layer in proportion to the applied voltage.

It should be noted that in the embodiment of FIG. 6 the high-field layer travels from the negative electrode 13 to the positive electrode 15. The high-field layer requires a minimum electric field intensity to be sustained within the substrate 61. Consequently, a cross-sectional shape variation of the region 61 may be advantageously used to control or vary the lifetime of the high-field layer. Thus, the enlarged cross-sectional region 61 encountered by a high-field layer may be judiciously provided with an electric field intensity below that necessary to sustain the high-field layer which therefore extinguishes at that point. The control of the electric field intensity is both a function of the voltage V and the shape of the tapered region of substrate 61. With the minimum sustaining field intensity chosen to be generally midway of the tapered region a linear modulation of the repetition rate of the laser pulses may be obtained.

As illustrated in FIG. 6B, wherein the abscissa represents time $t$ and the ordinate represents voltage V (or current $i$) supplied to this semiconductor device and light output L, the semiconductor device 60 is capable of changing the pulse interval $T_3$ of the laser light oscillation in response to the forward voltage applied across the semiconductor device.

An AC component 62 is superimposed on the forward DC voltage V by conventional modulating means. As a result, the semiconductor device 60 correspondingly changes the intervals between high-field layer formations, i.e., the oscillation frequency of the Gunn effect element. The device 60 is preferably operated by employing a forward DC bias voltage to the electrodes 13 and 15 of such magnitude that the distance travelled by the high-field layer in the Gunn effect element extends from the cathode 13 to near the center of the taper-shaped region 61. The magnitude of the superimposed AC voltage is adjusted so that the distance of travel of the high-field layer varies within the tapered region 61. Although, this device is capable of changing the pulse interval $T_3$ between laser pulses 63, the width of laser pulses 63 and 63' is maintained constant at a value determined by the time between the extinction and formation of the high-field layer in the Gunn effect element, and is this substantially independent of the AC component.

The semiconductor device 60 of this embodiment makes it possible to effect a pulse-repetition-frequency modulation of light pulses to input pulses of equal time width but varying in amplitude.

This type of laser modulation may be applied to a transmitter for a laser communication system or as a laser pulse generator with varying laser pulse repetitive times. In the tapered-shaped region 61, the field intensity distribution is changed by gradually increasing the cross-sectional area. A similar field intensity distribution can also be obtained by replacing the tapered-shaped region with a region whose impurity concentration (in effect a gradual resistance variation) is changed, as shown in the specification of the above-mentioned British Patent.

FIGS. 7A and 7B show a semiconductor device 70 according to a fourth embodiment of this invention, wherein the semiconductor device 40 of the second embodiment and a Gunn effect element 71 are formed on a highly insulative gallium-arsenic substrate 11. After coating the surface of each gallium-arsenic region with a dielectric film 72, a metallic conductive layer 73 is placed on the film. The operational characteristics of this semiconductor device 70 are shown in FIG. 8. As illustrated in this figure, the formation of the high-field layer in the semiconductor device 40 is controlled by trigger pulse outputs 81, 81', 81'' from the Gunn effect element 71. The Gunn effect element 71 produces oscillations with an oscillation period of $T_4$ which is made slightly smaller than the light suppression inert period $T_1$ (corresponding to the duration of a high-field layer in device 40). In this case, the period $T_1$ during which the internal current I of the semiconductor device 40 is kept at a low level corresponds to a light responseless period because $T_4$ is smaller than $T_1$. When the oscillation period $T_4$ of the Gunn effect element 71 is smaller than the period $T_1$ but larger than one-half of $T_1$, the trigger pulses 81, 81', 81'' provide or control light output pulses L from the semiconductor device 40 during a time period $T_4'$ which is determined by the difference between the period $T_1$ and the period $2T_4$. This difference in duration and consequently the light pulse width can be decreased and controlled more easily than in the above-described embodiments. In fact, the device of this embodiment is suitable for generating laser pulses of extremely short widths.

FIGS. 9A, 9B, and 9C show a semiconductor device 90 of according to a fifth embodiment of this invention, wherein metallic layers 92, 93, and 94 are formed by a metallizing process on the surface of a ceramic substrate 91. The semiconductor device 10 of the first embodiment and an amplifier semiconductor laser element 95 are located between those metallic layers as shown. In device 90, each of semiconductor laser elements 16 and 95 is substantially formed in the form of a semiconductor laser element having mirror-face resonators 18 and 19 on mutually facing sides. The laser elements 16 and 95 are separated into individual laser parts by a groove 97 in order to reduce current coupling between them to a negligible degree. The electrodes provided for supplying power to the semiconductor device 10 and the semiconductor laser element 95 consist of a common anode 96 for the semiconductor device 10 and semiconductor laser element 95, and cathode metallic layers 93 and 94 respectively for the semiconductor laser element 95 and for the semiconductor device 10. The semiconductor device 90 of this embodiment is capable of amplifying the output of laser light from the semiconductor device 10 by energizing said semiconductor device 10 through the semiconductor laser element 95 which is always supplied with a current sufficient to exceed the lasing threshold value.

Figure 10A:
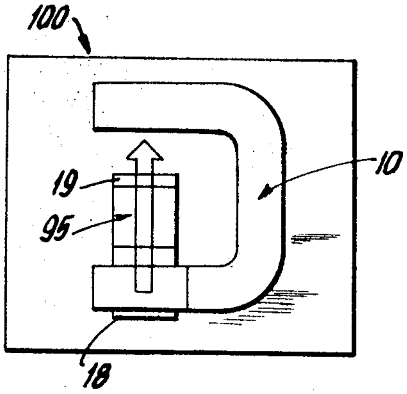
Figure 10B:
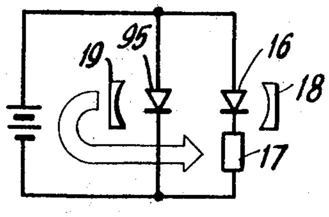

FIGS. 10A and 10B show a semiconductor device 100 according to a sixth embodiment of the invention. This embodiment is a modification of the semiconductor device 90 which has been described as the fifth embodiment. The semiconductor device 100 operates as an astable multivibrator by feeding back the laser light from semiconductor lasers 16 and 95 to a Gunn effect element 17 whose field intensity is not more than the threshold but more than the minimum field for sustaining the high-field layer. The semiconductor laser of this semiconductor device produces the laser action in this state and emits light on a part of the Gunn effect element 17 biased in the above-mentioned state. This feedback induces a photoconduction effect in the part of the Gunn effect element 17. As a result, a high-field layer is produced in the Gunn effect element 17, thereby reducing the internal current and thus stopping the laser action of the semiconductor laser element 16. This suppression of laser element operation terminates concurrently with the extinction of the high-field layer. This same operation is repeated upon the regeneration of the laser action. The duration of the laser light pulse in this case is the time needed to build up the high-field layer after the laser has resumed operation.

The multivibrator time periods are respectively determined by the time needed for the high-field layer to extinguish lasing action and the sum of the times needed to build up the high-field layer plus the time needed to resume laser action.

Figure 11A:
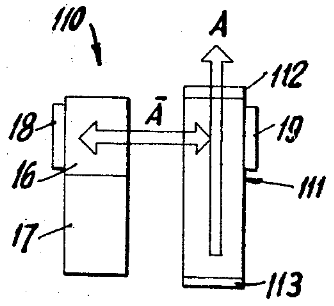
Figure 11B:
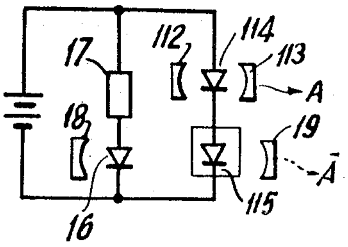
Figure 12A:
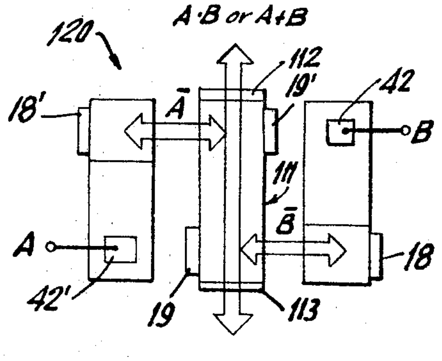
Figure 12B:
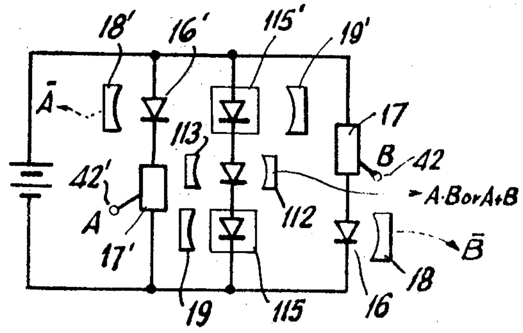

FIGS. 11A and 11B show a semiconductor device 110 according to a seventh embodiment of the invention. This semiconductor device 110 comprises a series component, as explained in the first embodiment having a semiconductor laser element 16 and a Gunn effect element 17, and a rectangular semiconductor laser element 111 disposed adjacent said semiconductor device of series elements. In the laser element 111, a PN junction face is located in the same plane as that of the laser element 17. The principal laser action A is secured within a resonator consisting of a pair of mirror faces 112 and 113 disposed between the mutually facing sides of the longitudinal direction of said rectangular laser element 111. The semiconductor device 110 is provided with another resonator between reflecting surfaces 18 and 19 which are photocoupled with the semiconductor laser element 16 to produce a laser action in the direction $\overline{A}$ crossing the principal laser action A. The laser oscillation produced between surfaces 18 and 19 of the resonator 16 intersects the principal laser action and effectively suppresses the principal laser action.

As shown in FIG. 11B schematically, a major laser element 114 and another laser element 115, which is provided for suppressing the laser action of the major laser element, are both formed on the rectangular laser element 111, so that the output of the principal laser action is driven to the NOT state by the laser oscillation produced between surfaces 18 and 19. The laser oscillation of the resonator 16 between surfaces 18—19 is produced when a forward current is flowing in the semiconductor laser element 16 with a magnitude which exceeds the lasing threshold level. The suppression effect of the lasing of resonator 16 on resonator 112—113, is, however, interrupted for the duration in which the high-field layer exists in the Gunn effect element 17. Thus, throughout the life of the high-field layer a laser output is obtained from one of the resonators 112 and 113.

FIG. 12 shows a semiconductor device 120 of an eighth embodiment of this invention, wherein two sets of series components are connected with the upper and the lower portions respectively of the rectangular laser element 111 which has been described referring to FIG. 11. The purpose of the series components is to produce a laser action in a direction crossing the principal laser action. The Gunn effect elements 17 and 17' of the respective series components are provided with their individual control electrodes 42 and 42'. More specifically, this semiconductor device 120 has two minor laser elements 115 and 115' for suppressing the laser action of the major laser element 114. This makes it possible to produce two suppression laser actions $\overline{A}$ and $\overline{B}$ by combining the semiconductor laser elements 16 and 16' which in turn are controlled by the Gunn effect elements 17 and 17', respectively. The suppression by these laser actions is inhibited for the duration when high-field layers exist in the respective Gunn effect elements 17 and 17'. Hence, the laser output from the principal laser action may be controlled by the high-field layers in the Gunn effect elements initiated by the trigger pulses A and B applied to the control electrodes 42 and 42'. When the internal electric fields of the Gunn effect elements 17 and 17' are kept at a level just below the field necessary to sustain high-field layer oscillations, an OR function may be obtained where either trigger pulse A or B produces a laser oscillation from the principal resonator 112—113.

Furthermore, by increasing the longitudinal distance of the major laser element (resonator 112—113), accompanied with a decrease in the width of said element, and a reduction in the reflection efficiency of the resonator surfaces 19 and 19' to attenuate the laser outputs of the elements 16–16', renders the semiconductor device 120 capable of extinguishing the principal laser action only when both suppression laser actions occur simultaneously. In this manner the laser light output from the principal laser action comprises an AND function where only the simultaneous occurrence of pulses A and B will produce lasing action from the resonator 112—113.

The laser action used for suppressing the major laser action described referring to FIGS. 11 and 12, can also be effectively obtained when the resonator formed of mirrors 18 and 19 includes only the semiconductor laser element 16. The laser output derived from the element 16 is then so arranged that its laser light is irradiated on the major laser element to suppress the principal laser action. The principal laser light output may be obtained also in such manner that an amplifier semiconductor laser element is also used to amplify the laser light output of the other semiconductor element. In this case, the suppression of laser action takes place in the amplifier laser element.

When a Gunn effect element having a nonuniform internal field as shown in FIG. 6 is substituted for the Gunn effect element of the embodiments shown in FIGS. 7, 9, 10, 11, and 12, the suppression action time can be varied.

Several embodiments of the invention have been explained referring only to a semiconductor device wherein the Gunn effect element is formed on a highly insulative gallium-arsenic substrate. However, the series Gunn effect element and the semiconductor laser element may be formed in such a manner that zinc may be diffused into the main surface of a crystalline piece of a generally available Gunn effect element, and that the surface of the P-type region so formed by said zinc diffusion may be used as the anode and the other main surface be used as the cathode.

When a Gunn effect element and the semiconductor laser element are disposed in common on an N-type gallium-arsenic region, the concentration of the semiconductor laser element may as desired by partially increased by a diffusion or an epitaxial growing technique. The series component of the Gunn effect element and the semiconductor laser element may be modified in many ways. For example, a branch as illustrated in FIG. 19 of U.S. Pat. No. 3,365,583 may be disposed on a portion of the Gunn effect element. Also, the semiconductor laser element may be divided into two, each of whose outputs may be emitted in different directions, thus providing various kinds of logic elements or output transmission means.

While the invention has been particularly shown and described with reference to preferred embodiments thereof, it should be understood by those skilled in the art that the scope of the art of this invention is not limited within the foregoing embodiments.

We claim:

1. A semiconductor device comprising a semiconductor element made of a material capable of supporting a travelling high electric field layer between its ends upon the establishment of an electric field intensity within the material in excess of a first threshold level, a semiconductor laser element having a PN junction placed in series connected relationship with the high layer supporting element with coupling between the high-field layer and the lasing action of the laser element, said laser element generating laser light upon the establishment of an electric current through said PN junction in excess of a second threshold level, means for applying an electrical signal across said series-connected high-field layer supporting element and laser element to supply an electric current to said laser which exceeds said second threshold level such that light is produced from said PN junction of the laser element, and to decrease the current below said second threshold level upon the occurrence of the high-field layer whereby laser light is suppressed from said laser element during the occurrence of each of said high-field layers.

2. The device as recited in claim 1 wherein the semiconductor element is formed of a semiconductor material of a first conductivity type and wherein the laser element includes a PN junction, with said semiconductor element forming a part of the junction.

3. The device as recited in claim 1 wherein the semiconductor element has a section of effective varying impedance to provide a varying electric field intensity between the ends thereof to vary the suppression of lasing action in correspondence with the varying lifetime of high-field layers.

4. The device as recited in claim 3 wherein the high-field layer supporting semiconductor element is provided with a tapered region of varying cross section to vary the lifetime of high-field layers.

5. The device as recited in claim 1 and further including a trigger electrode coupled to the semiconductor element through the insulation film or the rectifying layer between the ends thereof to control initiation of high electric field layers within the semiconductor element.

6. The device as recited in claim 5 and further including:

a second semiconductor element made of a material capable of supporting a high electric field layer travelling between the ends thereof at a preselected repetition rate, and an intermediate output electrode located on the second semiconductor element between the ends thereof to couple the high-field layer in the second semiconductor element to the triggering electrode.

7. The device as recited in claim 6 wherein the second semiconductor element is sized to provide high-field layers at intervals less than the lifetime of a high-field layer supporting semiconductor element.

8. The device as recited in claim 1 and further including amplifying semiconductor laser having a PN lasing junction in optical coupling relationship with the first laser element and connected in parallel with the series connected semiconductor element and first lasing element.

9. The device as recited in claim 1 and further including means responsive to the lasing action from the laser element for feeding the lasing action back to the high-field layer supporting element with an intensity sufficient to photon conductively initiate a high-field layer therein and terminate the lasing action.

10. The device as recited in claim 1 and further including a second semiconductor laser element placed generally transversely to the laser radiation from the first laser element to suppress lasing from the second laser element in response to lasing from the first element.

11. The device as recited in claim 10 wherein the first laser element is placed generally parallel with the second laser element, and wherein the first laser element includes a first resonator having a pair of facing reflectors with one reflector placed on the first laser element and the second reflector on the second element with the second laser element placed therebetween.

12. The device as recited in claim 11 and further including:

a third semiconductor laser element placed generally parallel with the first and second laser elements with the second laser element between the first and third laser elements, said third laser element having a resonator including a pair of reflectors with one reflector placed on the third element and the second reflector on the second element with the second laser element placed therebetween, said third laser element including a second PN junction.

a second semiconductor element made of a material capable of supporting a high electric field layer between the ends and placed in series relationship with the PN junction of the third laser element for lasing action control by high-field layers formed within the second semiconductor element.